(12) United States Patent
Hwang et al.

(10) Patent No.: US 11,936,969 B2
(45) Date of Patent: Mar. 19, 2024

(54) CAMERA MODULE

(71) Applicant: SAMSUNG ELECTRO-MECHANICS CO., LTD., Suwon-si (KR)

(72) Inventors: Se Yeon Hwang, Suwon-si (KR); Hyun Sang Kwak, Suwon-si (KR); Yeo Ok Jeon, Suwon-si (KR); Joon Woo Gi, Suwon-si (KR); Seok Hwan Kim, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 143 days.

(21) Appl. No.: 17/752,262

(22) Filed: May 24, 2022

(65) Prior Publication Data

US 2023/0199291 A1  Jun. 22, 2023

(30) Foreign Application Priority Data

Dec. 21, 2021  (KR) .......................... 10-2021-0183629

(51) Int. Cl.
*H04N 23/54* (2023.01)
*H04N 23/57* (2023.01)
*H05K 1/18* (2006.01)

(52) U.S. Cl.
CPC ............ *H04N 23/54* (2023.01); *H04N 23/57* (2023.01); *H05K 1/181* (2013.01); *H05K 2201/05* (2013.01); *H05K 2201/10151* (2013.01)

(58) Field of Classification Search
None
See application file for complete search history.

(56) References Cited

U.S. PATENT DOCUMENTS

2009/0166511 A1\* 7/2009 Kwon .................... G01J 1/0411
250/206

FOREIGN PATENT DOCUMENTS

| JP | 2001-160442 A | 6/2001 |
|---|---|---|
| KR | 20-0419912 Y1 | 6/2006 |
| KR | 10-2018-0114416 A | 10/2018 |

\* cited by examiner

*Primary Examiner* — Mark T Monk
(74) *Attorney, Agent, or Firm* — MORGAN, LEWIS & BOCKIUS LLP

(57) ABSTRACT

A camera module includes: a first substrate on which an image sensor configured to convert an optical signal incident through a lens module into an electrical signal is disposed and a first connection terminal is disposed; a second substrate spaced apart from the first substrate and including a second connection terminal formed in a position facing the first connection terminal; and a terminal connector electrically connecting the first connection terminal and the second connection terminal to each other and configured to maintain a preset distance between the first substrate and the second substrate. In the camera module, the terminal connector includes: a connecting member including a first connection portion, a second connection portion, and a deformable portion; and a support member configured to maintain the preset distance between the first substrate and the second substrate.

20 Claims, 16 Drawing Sheets

'A'

II-II

III-III

CAMERA MODULE

CROSS-REFERENCE TO RELATED APPLICATION(S)

The present application claims the benefit of priority to Korean Patent Application No. 10-2021-0183629 filed on Dec. 21, 2021 in the Korean Intellectual Property Office, the entire disclosure of which is incorporated herein by reference.

TECHNICAL FIELD

The present disclosure relates to a camera module configured to improve reliability of electrical contact between substrates spaced apart from each other.

BACKGROUND

A camera module has been used as means for autonomous driving or safe operation of a transportation means. For example, one or more camera modules may be installed on a front bumper, a rear bumper, and the like of a vehicle to provide information regarding objects located to the front and rear of the vehicle to a driver. A vehicle camera module is configured to not adversely affect structural stability of the vehicle and an appearance of the vehicle. For example, the vehicle camera module may be configured in a form in which a plurality of electronic components and substrates are arranged in a vertical direction (that is, an optical-axis direction) to facilitate a significant reduction of an installation area. However, the above-described form is a structure in which a plurality of substrates are connected using a flexible substrate. Such a structure not only may require a space for deformation of the flexible substrate, but also may cause poor connection between the substrates due to folding or damage of the flexible substrate, which is problematic.

SUMMARY

An aspect of the present disclosure may provide a camera module configured to improve connection reliability and assemblability between substrates.

According to an aspect of the present disclosure, a camera module may include: a first substrate on which an image sensor configured to convert an optical signal incident through a lens module into an electrical signal is disposed and a first connection terminal is disposed; a second substrate spaced apart from the first substrate and including a second connection terminal formed in a position facing the first connection terminal; and a terminal connector electrically connecting the first connection terminal and the second connection terminal to each other and configured to maintain a preset distance between the first substrate and the second substrate. In the camera module, the terminal connector may include: a connecting member including a first connection portion, a second connection portion, and a deformable portion; and a support member configured to maintain the preset distance between the first substrate and the second substrate.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
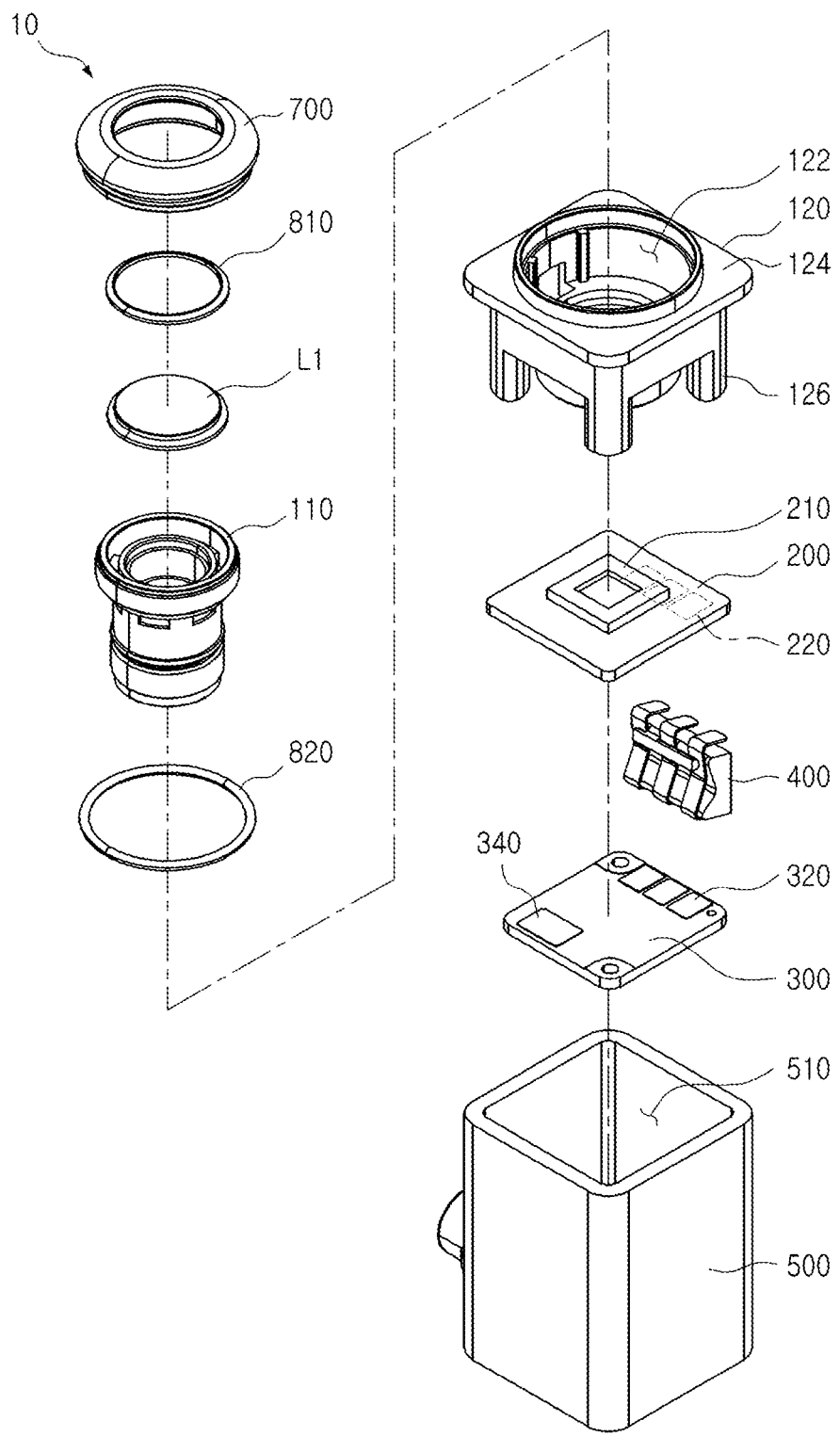
FIG. 1 is an exploded perspective view of a camera module according to an exemplary embodiment.

Hereinafter, exemplary embodiments in the present disclosure will be described in detail with reference to the accompanying drawings.

A camera module described in the present specification may be mounted on a transportation device. For example, the camera module according to the present specification may be mounted as a front and rear monitoring camera or an autonomous driving camera on a passenger car, a truck, a freight car, a fire truck, a forklift, or the like. However, the use ranges and use examples of the camera module described in the present specification are not limited to the above-described devices. For example, the camera module may also be mounted as an image capturing camera on a surveillance drone, a transport drone, or the like.

A camera module according to a first aspect in the present disclosure may include a first substrate, a second substrate, and a terminal connector. However, components of the camera module according to the first aspect are not limited to the above-described members. For example, the camera module may further include a lens module accommodating one or more lenses, a housing configured to accommodate the above-described members, and the like.

The camera module according to the first aspect may include a plurality of electronic components. For example, the camera module may include an image sensor disposed on the first substrate. However, the electronic component included in the camera module is not limited to the image sensor. For example, the camera module may further include a passive element and a power supply element disposed on the second substrate.

The camera module according to the first aspect may be configured to facilitate electrical connection between the first substrate and the second substrate. For example, a first connection terminal of the first substrate and a second connection terminal of the second substrate may be rapidly and stably connected by a connecting member of the terminal connector, the connecting member including a first connection portion that is in surface-contact with the first connection terminal, a second connection portion that is in surface-contact with the second connection terminal, and a deformable portion that connect the first connection portion and the second connection portion to each other and is elastically deformable according to a distance between the first substrate and the second substrate.

The camera module according to the first aspect may be configured to maintain a constant distance between the first substrate and the second substrate. For example, a predetermined distance between the first substrate and the second substrate may be maintained by a support member of the terminal connector.

The camera module according to the first aspect configured as above has a structure in which the first substrate and the second substrate are stacked in a vertical direction (or an optical-axis direction of the lens module) and are thus naturally electrically connected to each other. Therefore, an assembly process for the camera module may be simplified. Furthermore, in the camera module according to the first aspect, the use of a flexible printed circuit board (FPCB) for connecting the first substrate and the second substrate may be omitted, such that manufacturing costs of the camera module may be reduced. In addition, since the camera module according to the first aspect may secure a sufficient contact area between the first connection terminal of the first substrate and the second connection terminal of the second substrate, an electrical signal characteristic of the camera module may be improved.

Hereinafter, a camera module according to a specific exemplary embodiment will be described with reference to the accompanying drawings.

First, a camera module according to an exemplary embodiment will be described with reference to FIGS. 1 through 6.

A camera module 10 according to the present exemplary embodiment may include a lens module 100, a first substrate 200, a second substrate 300, and a terminal connector 400. However, components of the camera module 10 are not limited to the above-described members. For example, the camera module 10 may further include a housing 500, a cover member 700, and airtight members 810 and 820.

The lens module 100 may include a lens barrel 110 and a barrel holder 120. However, the configuration of the lens module 100 is not necessarily separated into the lens barrel 110 and the barrel holder 120. For example, the lens module 100 may have a configuration in which the lens barrel 110 and the barrel holder 120 are integrally coupled to each other.

The lens barrel 110 may include one or more lenses L1. For example, the lens barrel 110 may include four or more lenses L1 sequentially arranged along an optical axis from an object side. However, the number of lenses L1 accommodated in the lens barrel 110 is not limited to four. For example, the number of lenses L1 accommodated in the lens barrel 110 may be increased to five or more or decreased to three or less depending on the type of the camera module 10.

The barrel holder 120 may be coupled to the lens barrel 110. For example, an accommodation space 122 for accommodating the lens barrel 110 may be formed in the barrel holder 120. The barrel holder 120 may fix the lens barrel 110 to the housing 500. For example, the barrel holder 120 may be coupled to the housing 500 via a flange portion 124 to fix a position of the lens barrel 110 with respect to the housing 500. The barrel holder 120 may include a component for coupling or contacting with the first substrate 200. For example, a plurality of legs 126 that are in contact with the first substrate 200 may be formed in a lower portion of the barrel holder 120.

The first substrate 200 may be coupled to the barrel holder 120. For example, the first substrate 200 may be coupled to the legs 126 of the barrel holder 120 using a separate coupling member. As a specific example, the first substrate 200 may be fixed to the legs 126 of the barrel holder 120 using a bolt or an adhesive. However, the member for coupling between the first substrate 200 and the barrel holder 120 is not limited to the bolt and the adhesive.

An electronic component necessary for an operation of the camera module 10 may be mounted on the first substrate 200. For example, an image sensor 210 for converting an optical signal incident through the lens L1 of the lens barrel 110 into an electrical signal may be mounted on the first substrate 200. However, the electronic component installed or mounted on the first substrate 200 is not limited to the image sensor 210. For example, a passive element or a driving element for assisting in driving of the image sensor 210 may be further mounted on the first substrate 200.

The first substrate 200 may include a component for electrically connection to another component (for example, the second substrate 300). For example, one or more first connection terminals 220 may be formed on one surface (a bottom surface in FIG. 1) of the first substrate 200. The first connection terminal 220 may be electrically connected to the image sensor 210. For example, the first connection terminal 220 may be electrically connected to the image sensor 210 through a printed circuit formed inside or on a surface of the first substrate 200. Accordingly, the electrical signal of the image sensor 210 may be transmitted to the second substrate 300 through the first connection terminal 220.

The second substrate 300 may be spaced apart from the first substrate 200 at a predetermined interval. For example, the second substrate 300 may be spaced apart from one surface (that is, the bottom surface) of the first substrate 200 by a predetermined distance to prevent interference with the electronic component mounted on an upper side of the second substrate 300 or the bottom surface of the first substrate 200.

An electronic component necessary for driving of the camera module 10 may be mounted on the second substrate 300. For example, a power supply unit 340 for supplying a current required to drive the image sensor 210 may be mounted on one surface or the other surface of the second substrate 300. However, the electronic component mounted on the second substrate 300 is not limited to the power supply unit 340. For example, a passive element necessary for driving of the image sensor 210 may be further mounted on the second substrate 300.

The second substrate 300 may include a component for electrical connection to the first substrate 200. For example, one or more second connection terminals 320 may be formed on one surface (an upper surface in FIG. 1) of the second substrate 300. The second connection terminal 320 may be electrically connected to the above-described power supply unit 340. For example, the second connection terminal 320 may be electrically connected to the power supply unit 340 through a printed circuit formed inside or on the surface of the second substrate 300. Accordingly, the current of the power supply unit 340 may be supplied to the outside through the second connection terminal 320.

The terminal connector 400 may electrically connect the first substrate 200 and the second substrate 300 to each other. In detail, the terminal connector 400 may be in contact with each of the first connection terminal 220 of the first substrate 200 and the second connection terminal 320 of the second substrate 300 to electrically connect the first substrate 200 and the second substrate 300 to each other. The terminal connector 400 may be fixed to the first substrate 200 or the second substrate 300. For example, one end of the terminal connector 400 may be fixed to the first connection terminal 220 of the first substrate 200 or to the second connection terminal 320 of the second substrate 300. A detailed configuration of the terminal connector 400 and effects thereof will be described later with reference to FIGS. 2 and 3.

The housing 500 may accommodate important components of the camera module 10. For example, the lens module 100, the first substrate 200, the terminal connector 400, and the second substrate 300 may be disposed in the accommodation space 510 of the housing 500. The lens module 100, the first substrate 200, the terminal connector 400, and the second substrate 300 may be sequentially disposed in the accommodation space 510 of the housing 500. In detail, the second substrate 300 may be disposed at the lowermost portion of the accommodation space 510, and the terminal connector 400, the first substrate 200, and the lens module 100 may be sequentially disposed above the second substrate 300. The lens module 100, the first substrate 200, the terminal connector 400, and the second substrate 300 may be sequentially stacked in the accommodation space 510 of the housing 500 and coupled to or electrically connected to one another. For example, the first substrate 200, the terminal connector 400, and the second substrate 300 may be stacked in the accommodation space 510 of the housing 500 and electrically connected to one another at the same time. Therefore, in the camera module 10 according to the present exemplary embodiment, a separate process for connecting the first substrate 200 and the second substrate 300 to each other may be omitted, and the flexible substrate and a space for bending deformation of the flexible substrate required for electrical connection between the first substrate 200 and the second substrate 300 may also be omitted or reduced.

The cover member 700 may fix the lens barrel 110 to the barrel holder 120. For example, the cover member 700 may be coupled to the barrel holder 120 using a screw, an adhesive, or the like to firmly fix the lens barrel 110 to the barrel holder 120.

The airtight members 810 and 820 may block a gap between the members of the camera module 10. As an example, a first airtight member 810 may block a gap between the lens barrel 110 and the cover member 700, and a second airtight member 820 may block a gap between the lens barrel 110 and the barrel holder 120. For reference, although not illustrated in FIG. 1, a separate airtight member may be further disposed between the barrel holder 120 and the housing 500 if necessary.

Next, a detailed structure of the terminal connector will be described with reference to FIGS. 2 and 3.

The terminal connector 400 according to the present specification may include a connecting member 410 and a support member 420. The connecting member 410 may be formed of a metal material to electrically connect the first connection terminal 220 of the first substrate 200 and the second connection terminal 320 of the second substrate 300 to each other, and the support member 460 may be formed of a material having a predetermined rigidity to maintain a preset degree of compression deformation or compression displacement of the connecting member 410. The number of connecting members 410 may be plural. For example, the terminal connector 400 may include three connecting members 410 arranged at intervals in one direction of the support member 420 as illustrated in FIG. 2. However, the number of the connecting members 410 included in the terminal connector 400 is not limited to three. For example, the terminal connector 400 may include three or more connecting members 410 according to the type of the camera module 10.

The connecting member 410 may include a first connection portion 412, a second connection portion 414, and a deformable portion 416. The first connection portion 412 may be in contact with the first connection terminal 220 of the first substrate 200, and may be formed so as to maximize a contact area between the first connection portion 412 and the first connection terminal 220. For example, the first connection portion 412 may be disposed to face the first connection terminal 220, and may be formed parallel to one surface (that is, the surface) of the first connection terminal 220. The second connection portion 414 may be in contact with the second connection terminal 320 of the second substrate 300, and may be formed so as to maximize a contact area between the second connection portion 414 and the second connection terminal 320. For example, the second connection portion 414 may be disposed to face the second connection terminal 320, and may be formed parallel to one surface (that is, the surface) of the second connection terminal 320. The deformable portion 416 may connect the first connection portion 412 and the second connection portion 414 to each other, and may be configured to be able to vary a distance G between the first connection portion 412 and the second connection portion 414. For example, the deformable portion 416 may be elastically deformed by an external force applied to the connecting member 410. The deformable portion 416 may be easily elastically deformed. For example, the deformable portion 416 may protrude toward the support member 420 or may be bent or curved toward the support member 420.

The deformable portion 416 may include a first connecting portion 4162 and a second connecting portion 4164. The first connecting portion 4162 may be formed to have a first angle $\theta 1$ with respect to the first connection portion 412, and the second connecting portion 4164 may be formed to have a second angle $\theta 2$ with respect to the second connection portion 414. In addition, the first connecting portion 4162 and the second connecting portion 4164 may be formed to have a third angle $\theta 12$ with respect to each other. As described above, when an external force is applied to the connecting member 410, the deformable portion 416 formed as described above may be deformed in such a manner that the angles $\theta 1$, $\theta 2$, and $\theta 12$ are decreased.

The deformable portion 416 may be quantitatively or formally deformed by the external force applied to the connecting member 410. As a specific example, the angles $\theta 1$, $\theta 2$, and $\theta 12$ of the deformable portions 416 may have a predetermined magnitude relationship. For example, the first angle $\theta 1$ and the second angle $\theta 2$ may have the same size, and the sum of the first angle $\theta 1$ and the second angle $\theta 2$ may be equal to the third angle $\theta 12$.

Since the deformable portion 416 satisfying the above-described relationship may always keep positions of the first connection portion 412 and the second connection portion 414 in a horizontal direction constant, reliability of the electrical connection between the first substrate 200 and the second substrate 300 by the connecting member 410 may be improved.

The support member 420 may be disposed between the first connection portion 412 and the second connection portion 414, and may have a height h smaller than the distance G between the first connection portion 412 and the second connection portion 414. The support member 420 may be configured in such a manner that surface-contact between the connection portions 412 and 414 of the connecting member 410 and the connection terminals 220 and 320 may be firmly made. For example, an upper surface portion 422 and a lower surface portion 424 of the support member 420 may be formed parallel to the first connection terminal 220 and the second connection terminal 320, respectively. The upper surface portion 422 and the lower surface portion 424 of the support member 420 formed as described above may apply a force to the connection portions 412 and 414 deformed by an external impact or heat so that the connection portions 412 and 414 are in close contact with the first connection terminal 220 and the second connection terminal 320, respectively.

The support member 420 may include a component for guiding or limiting the bending deformation of the deformable portion 416. For example, the support member 420 may include a recess portion 428 facing the deformable portion 416 and having predetermined inclinations 63 and 64 with respect to the upper surface portion 422 and the lower surface portion 424, respectively. The recess portion 428 may have a shape substantially similar to that of the deformable portion 416. However, the recess portion 428 does not necessarily have a shape that is the same as or similar to the deformable portion 416. For example, an angle θ34 formed at the center of the recess portion 428 may be smaller than the third angle θ12 of the deformable portion 416. For reference, in a case where the angle θ34 of the recess portion 428 is smaller than the third angle θ12 of the deformable portion 416, there is an advantage in that compression deformation of the deformable portion 416 may be smoothly induced. However, the angle θ34 of the recess portion 428 is not necessarily smaller than the third angle θ12 of the deformable portion 416.

The support member 420 may further include a component for suppressing or reducing deformation or damage to the upper surface portion 422, the lower surface portion 424, and the recess portion 428. For example, the support member 420 may further include support portions 426 extending in a direction in which the upper surface portion 422 and the lower surface portion 424 oppose each other. The support portions 426 may be provided in plural to be arranged at predetermined intervals in a width direction of the support member 420.

The support member 420 may further include a component for aligning the position of the first connection portion 412 or the second connection portion 414. For example, a groove 4242 that may accommodate the second connection portion 414 and align the position of the second connection portion 414 may be formed in the lower surface portion 424 of the support member 420. For reference, in the accompanying drawings, only the lower surface portion 424 of the support member 420 has the groove 4242, but the groove may also be formed in the upper surface portion 422 of the support member 420 as needed. The support member 420 may further include a component for preventing separation of the connecting member 410. For example, a clip 430 for pressing the connecting member 410 toward the support member 420 may be formed on the support member 420. In one embodiment, the clip 430 may protrude from a rear surface of the support member 420 and further extend to support a portion of the deformable portion 416, and the portion of the deformable portion supported by the clip 430 may be disposed between the clip 430 and the support member 420.

The support member 420 may fix the connecting member 410 to the first substrate 200 or the second substrate 300. For example, the support member 420 may be firmly fixed to any one of the first substrate 200 and the second substrate 300 by an adhesive or a separate coupling member.

Figure 4:
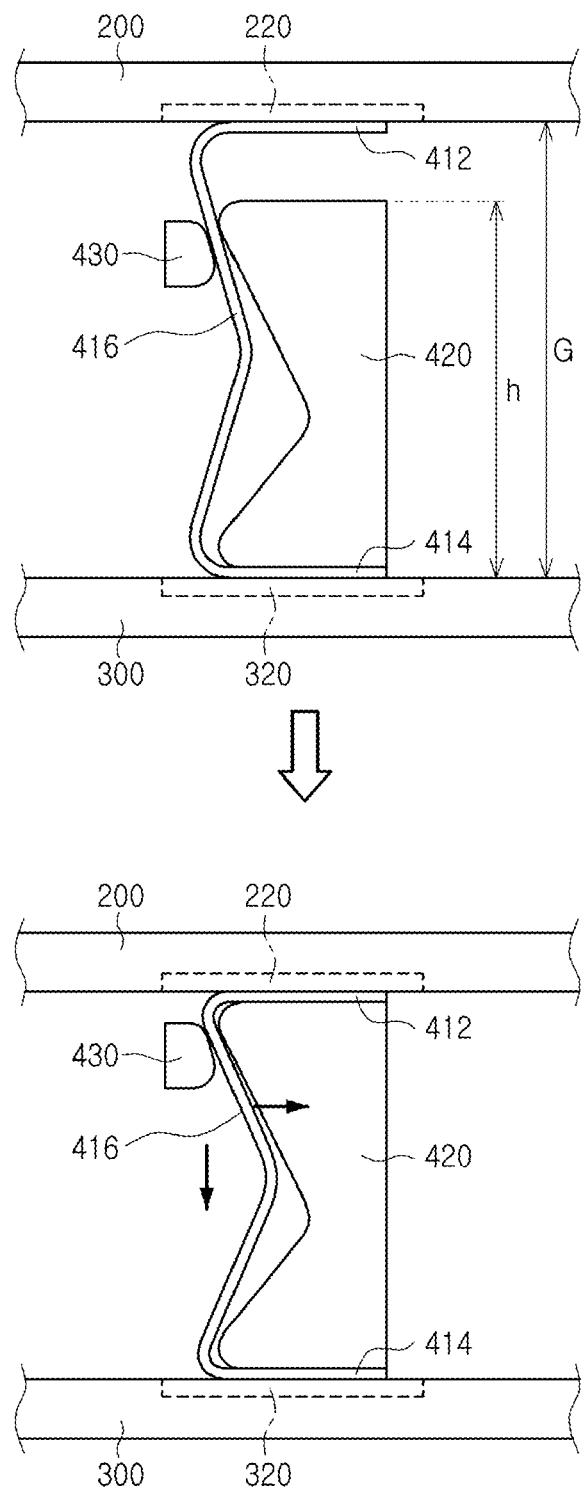
FIG. 4 is a cross-sectional view illustrating an operating state of the terminal connector according to positions of first and second substrates.

Next, a detailed operation state of the above-described terminal connector will be described with reference to FIG. 4.

The terminal connector 400 may electrically connect the first substrate 200 and the second substrate 300 to each other without an additional process. For example, the terminal connector 400 may enable electrically connection between the first connection terminal 220 of the first substrate 200 and the second connection terminal 320 of the second substrate 300 through the connecting member 410 as illustrated in (upper side of) FIG. 4. The first connection portion 412 and the second connection portion 414 of the connecting member 410 may be configured in such a manner that the first connection portion 412 of the connecting member 410 and the first connection terminal 220 of the first substrate 200 have the maximum contact area, and the second connection portion 414 of the connecting member 410 and the second connection terminal 320 of the second substrate 300 have the maximum contact area. For example, since the first connection portion 412 and the second connection portion 414 of the connecting member 410 have a tendency to maintain the predetermined distance G by the deformable portion 416, a distance between the first substrate 200 and the second substrate 300 may be smaller than the above-described distance G, such that the connection area and connection reliability between the connection portions 412 and 414 and the connection terminals 220 and 320 may be increased and improved.

The terminal connector 400 may be configured to maintain a constant distance between the first substrate 200 and the second substrate 300. For example, the terminal connector 400 may maintain a constant distance between the first connection portion 412 and the second connection portion 414, such that the first substrate 200 is suppressed and prevented from being excessively close to the second substrate 300.

Therefore, in the camera module 10 according to the present exemplary embodiment, the first substrate 200 and the second substrate 300 may be electrically connected to each other through a process of disposing the first substrate 200 above the second substrate 300, and a constant distance between the first substrate 200 and the second substrate 300 may be maintained, which is advantageous.

Next, an external structure and a cross-sectional structure of the camera module will be described with reference to FIGS. 5 and 6.

Figure 5:
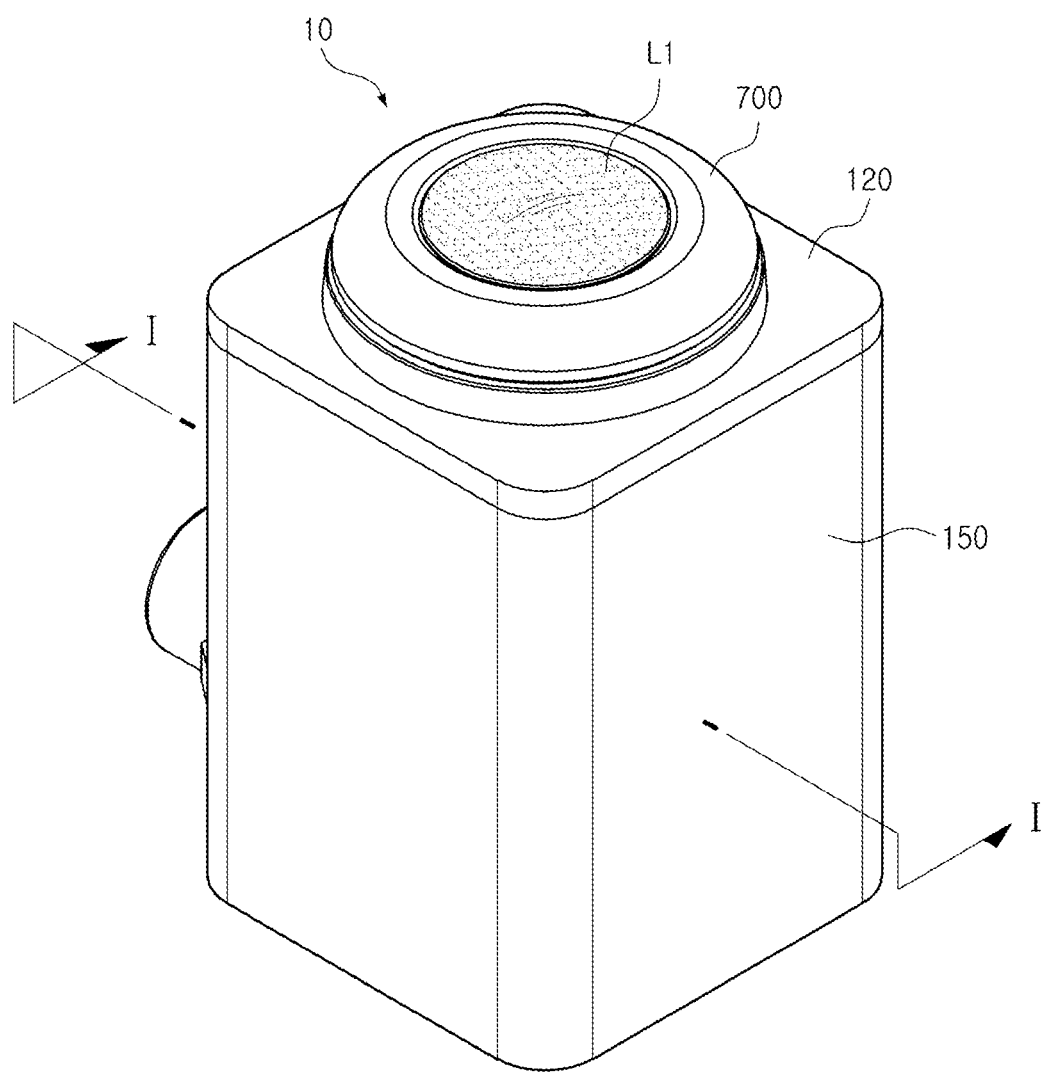
FIG. 5 is an assembled perspective view of the camera module illustrated in FIG. 1.

As illustrated in FIG. 5, the camera module 10 according to the present exemplary embodiment may be configured in a form in which main components of the camera module 10 are accommodated in the housing 500. Accordingly, the camera module 10 according to the present exemplary embodiment may be installed in any place as long as the housing 500 may be accommodated therein.

Figure 6:
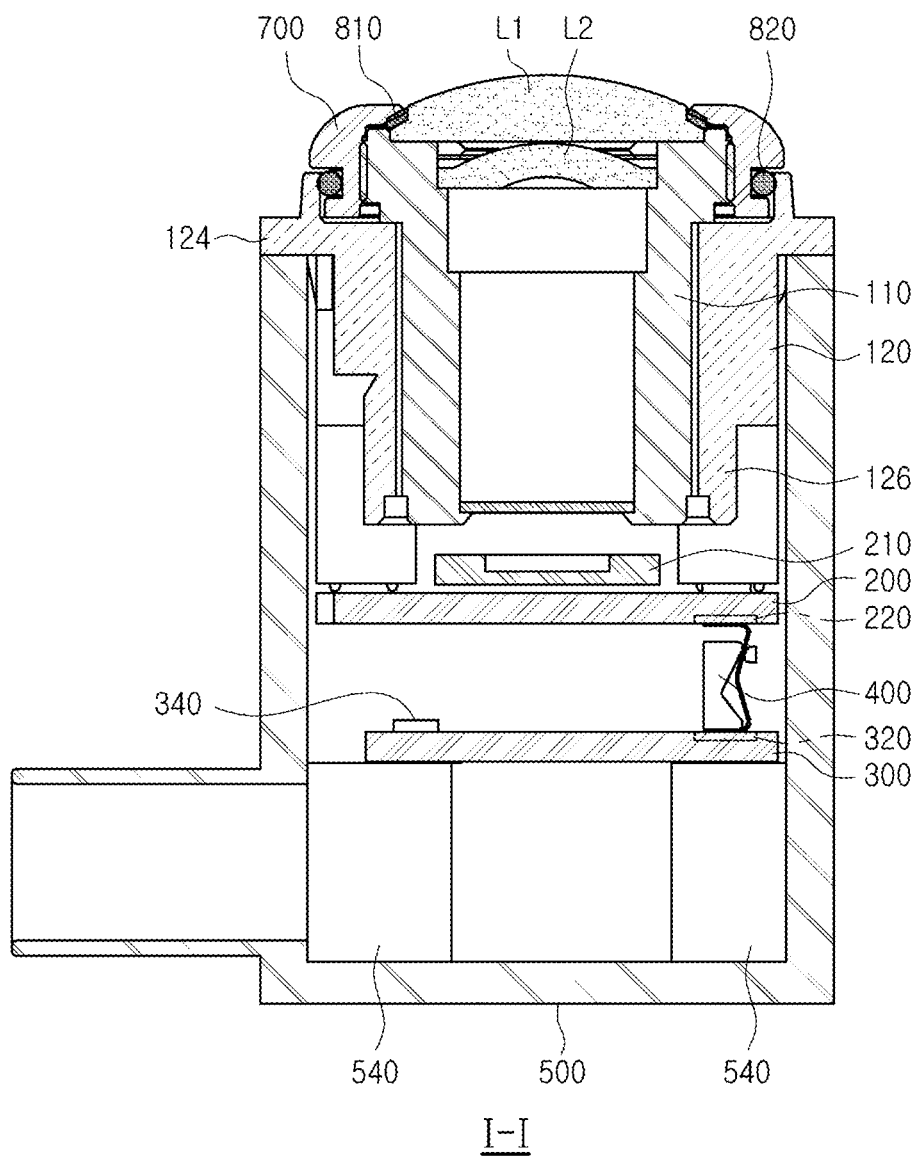
FIG. 6 is a cross-sectional view of the camera module illustrated in FIG. 5.

The camera module 10 may have a structure in which the lens barrel 110, the barrel holder 120, the first substrate 200, and the second substrate 300 are sequentially disposed from the top to the bottom as illustrated in FIG. 6. The first airtight member 810 may be disposed between the lens barrel 110 and the cover member 700 or between the first lens L1 and the cover member 700, and the second airtight member 820 may be disposed between the lens barrel 110 and the barrel holder 120. For reference, a plurality of lenses including a second lens L2 may be sequentially arranged inside the lens barrel 110.

The camera module 10 may be assembled in an order which is the reverse of the disposition order of the lens barrel 110, the barrel holder 120, the first substrate 200, the terminal connector 400, and the second substrate 300. For example, the second substrate 300, the first substrate 200, the barrel holder 120, and the lens barrel 110 may be sequentially disposed inside the housing 500. For reference, the terminal connector 400 may be assembled in a state of being integrally coupled to the first substrate 200 or the second substrate 300, and the second substrate 300 may be fixed at a predetermined position by a supporting portion 540 formed inside the housing 500.

The first substrate 200 and the second substrate 300 may be firmly connected to each other by the barrel holder 120 being disposed in the housing 500. For example, electrical connection between the first substrate 200 and the second substrate 300 may be naturally made by the barrel holder 120 pressing the first substrate 200.

The terminal connector 400 according to the present exemplary embodiment may be deformed into various forms. Hereinafter, a deformation form of the terminal connector will be described with reference to FIGS. 7 through 11.

Figure 2:
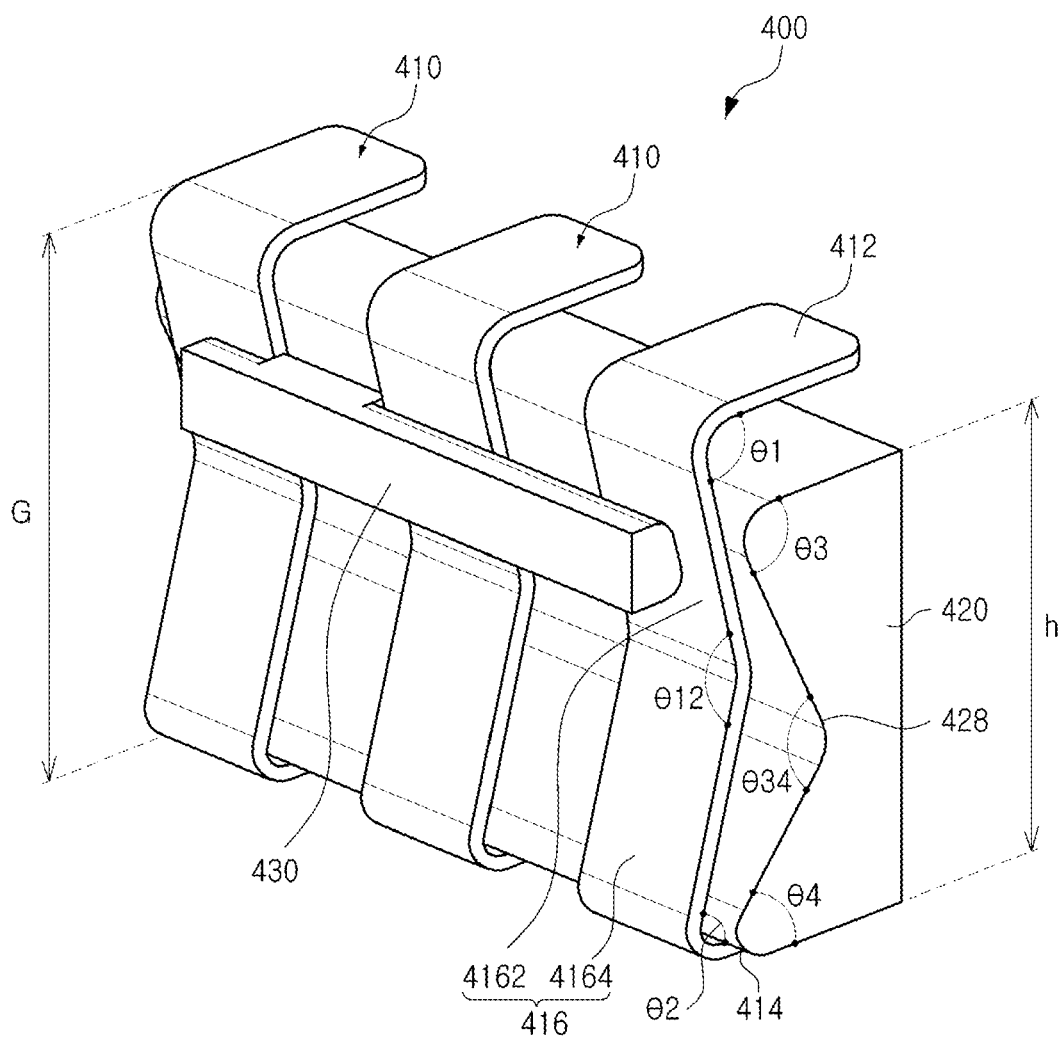
FIG. 2 is an enlarged perspective view of a terminal connector illustrated in FIG. 1.
Figure 3:
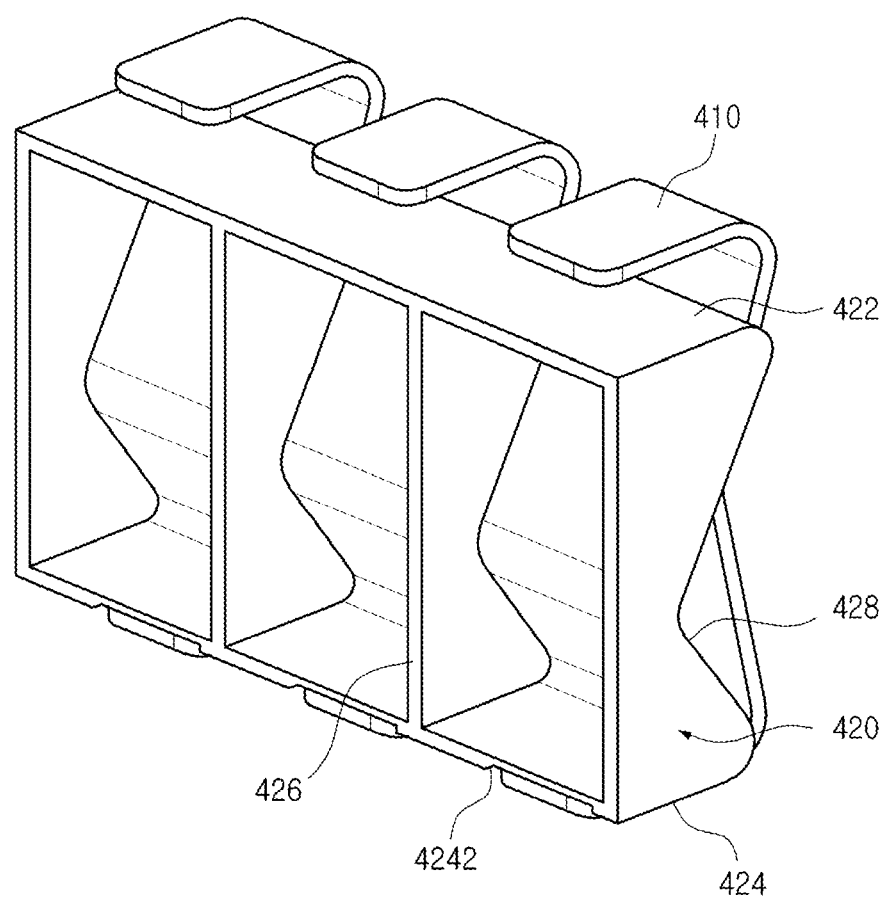
FIG. 3 is a rear perspective view of the terminal connector illustrated in FIG. 2.
Figure 7:
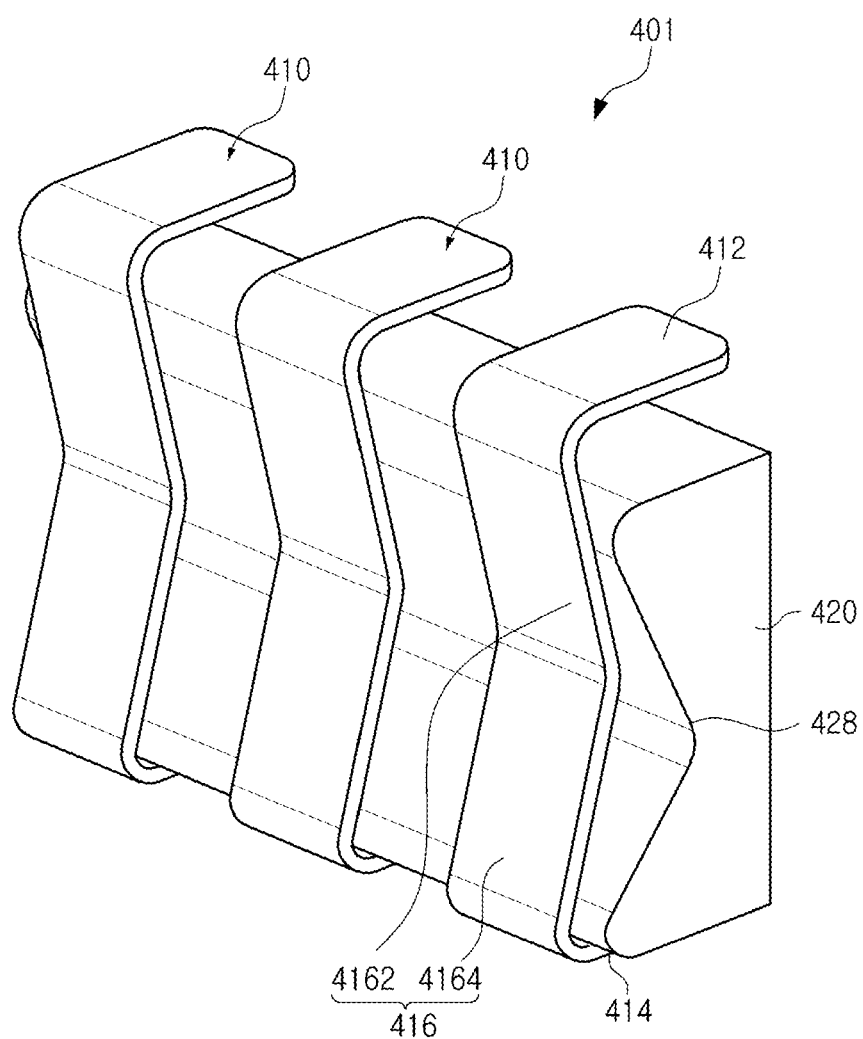
FIG. 7 is a perspective view of a terminal connector according to a modified example.

A terminal connector 401 according to a first modified example may be substantially the same as that illustrated in FIG. 2. For example, the terminal connector 401 according to the first modified example may be configured in such a manner that the clip 430 is omitted as illustrated in FIG. 7.

Figure 8:
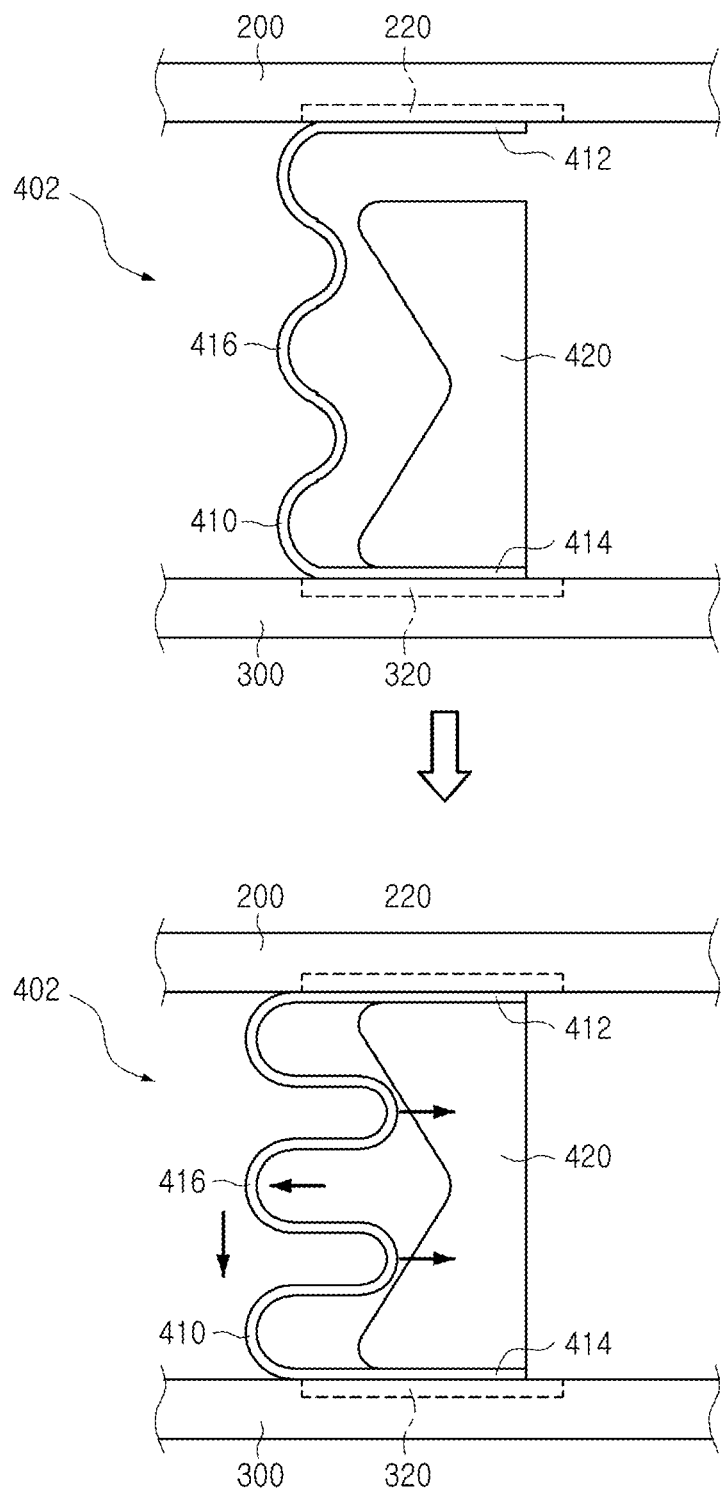
FIGS. 8, 9, 10 and 11 are cross-sectional views of terminal connectors according to other modified examples.

A terminal connector 402 according to a second modified example may be configured in such a manner that a deformable portion 416 has a plurality of bends as illustrated in FIG. 8. The terminal connector 402 configured as described above may have an advantage that elastic deformation of the deformable portion 416 may be easily made, and a vertical displacement width of the deformable portion 416 may be increased.

Figure 9:
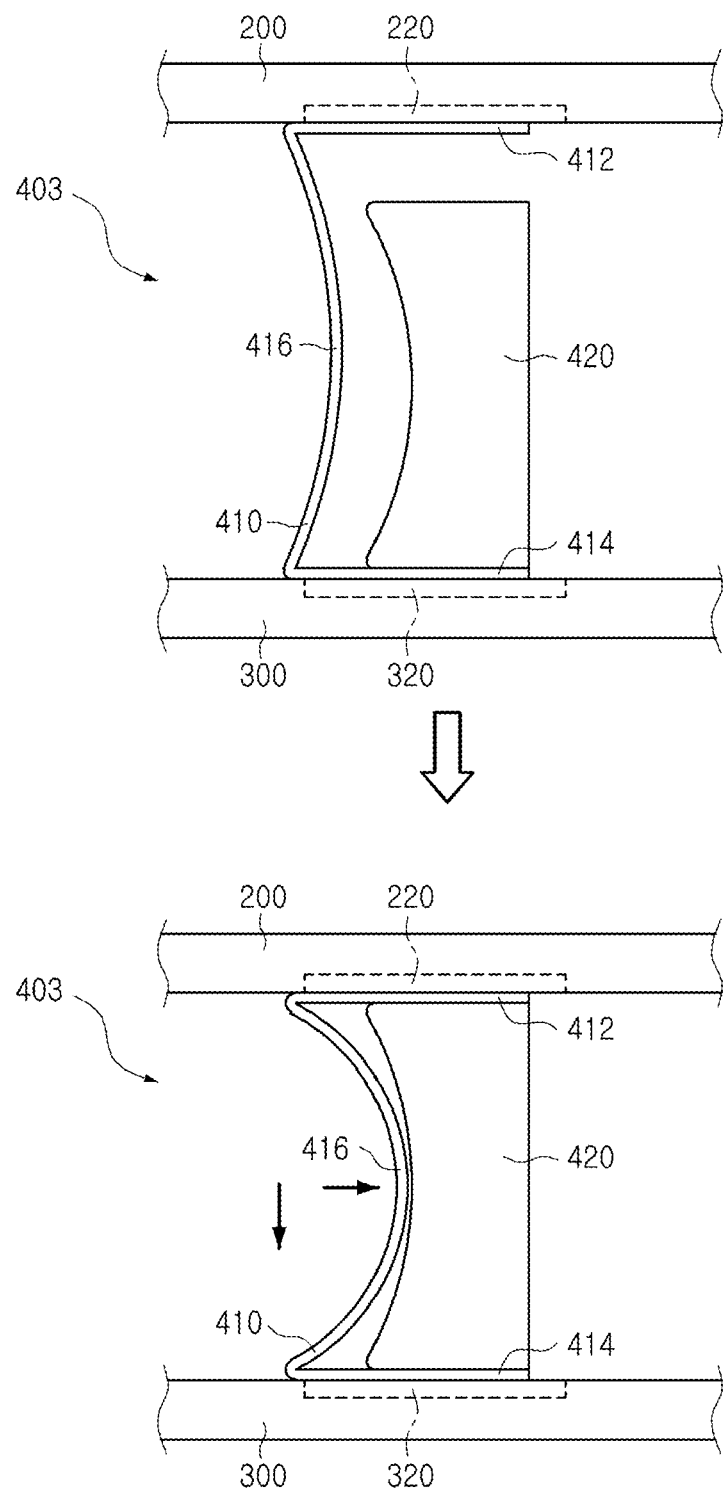

A terminal connector 403 according to a third modified example may include an arcuate deformable portion 416 as illustrated in FIG. 9. The deformable portion 416 of the terminal connector 403 having the above-described configuration has a simple shape. Therefore, manufacturing thereof may be easy, manufacturing costs may be reduced.

Figure 10:
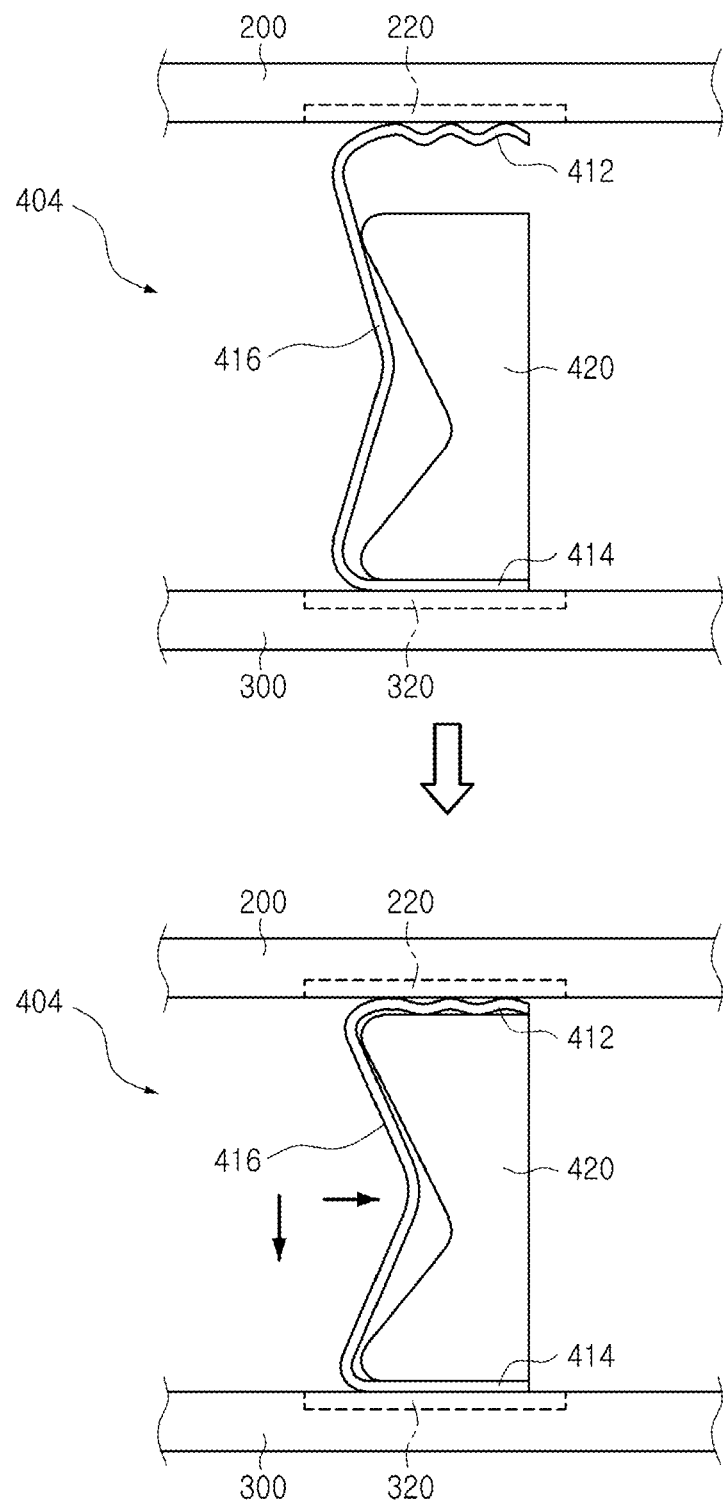

A terminal connector 404 according to a fourth modified example may include a first connection portion 412 having a bend 4122 as illustrated in FIG. 10. The bend 4122 may be deformed to be substantially flat or curved when the first connection portion 412 and the first connection terminal 220 of the first substrate 200 are connected to each other. The terminal connector 404 having the above-described configuration may increase reliability of contact between the first connection portion 412 and the first connection terminal 220 of the first substrate 200 using an elastic force of the bend 4122.

Figure 11:
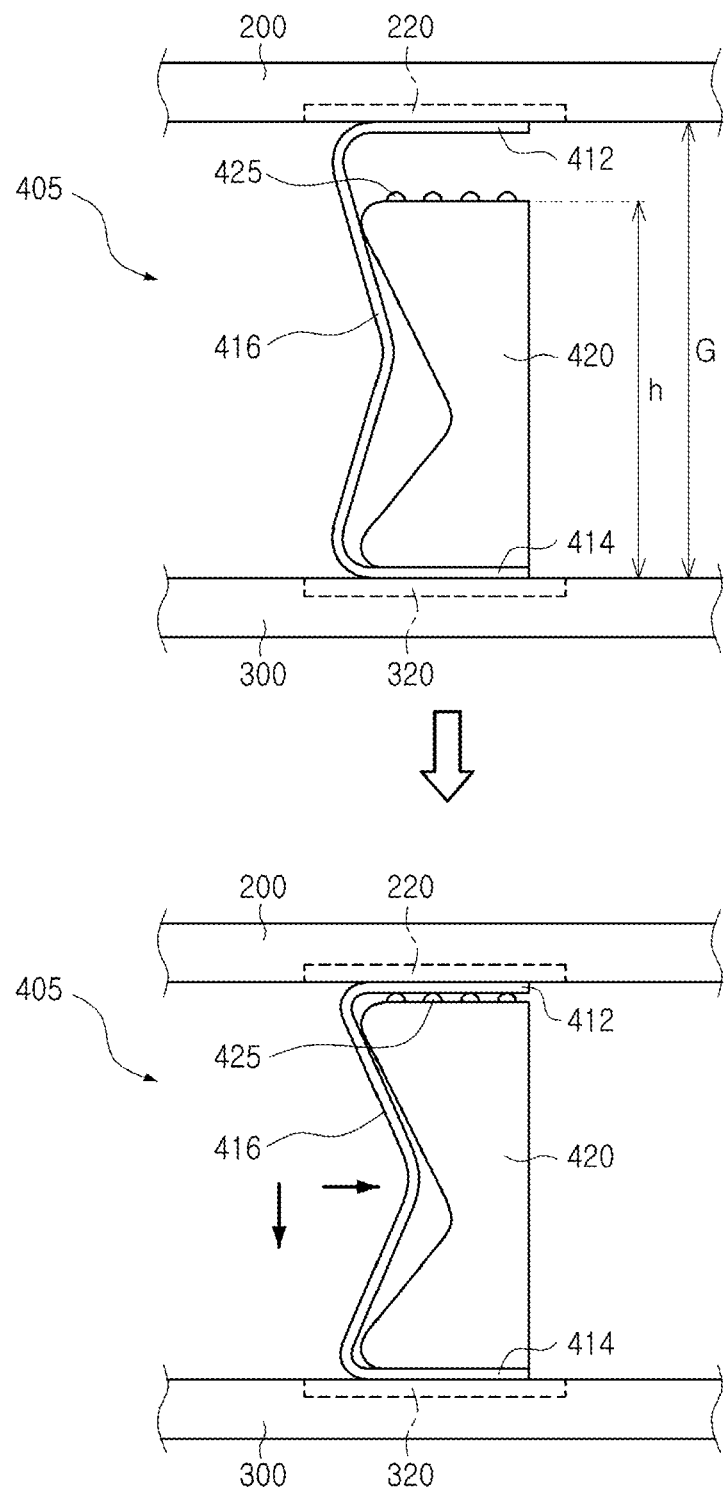

A terminal connector 405 according to a fifth modified example may include a support member 420 on which a protrusion 425 is formed as illustrated in FIG. 11. The protrusion 425 may serve to press the first connection portion 412 of the connecting member 410 toward the first connection terminal 220 of the first substrate 200. Accordingly, the terminal connector 405 according to this modified example may improve the reliability of contact between the first connection portion 412 and the first connection terminal 220 of the first substrate 200, similarly to the terminal connector 404 according to the fourth modified example.

Next, a camera module according to another exemplary embodiment will be described with reference to FIG. 12.

A camera module 12 according to the present exemplary embodiment may include a lens module 100, a first substrate 200, a second substrate 300, and a terminal connector 400. However, components of the camera module 12 are not limited to the above-described members. For example, the camera module 10 may further include a housing 500, a cover member 700, and airtight members 810 and 820.

The lens module 100 may include a lens barrel 110 and a barrel holder 120. However, the configuration of the lens module 100 is not necessarily separated into the lens barrel 110 and the barrel holder 120. For example, the lens module 100 may have a configuration in which the lens barrel 110 and the barrel holder 120 are integrally coupled to each other.

The lens barrel 110 may include one or more lenses L1 and L2. For example, the lens barrel 110 may include four or more lenses L1 and L2 sequentially arranged along an optical axis from an object side. However, the number of lenses L1 and L2 accommodated in the lens barrel 110 is not limited to four. For example, the number of lenses L1 accommodated in the lens barrel 110 may be increased to five or more or decreased to three or less depending on the type of the camera module 12.

The barrel holder 120 may be coupled to the lens barrel 110. For example, an accommodation space 122 for accommodating the lens barrel 110 may be formed in the barrel holder 120. The barrel holder 120 may fix the lens barrel 110 to the housing 500. For example, the barrel holder 120 may be coupled to the housing 500 via a flange portion 124 to fix a position of the lens barrel 110 with respect to the housing 500. The barrel holder 120 may include a component for coupling or contacting with the first substrate 200. For example, a plurality of legs 126 that are in contact with the first substrate 200 may be formed in a lower portion of the barrel holder 120.

The first substrate 200 may be coupled to the barrel holder 120. For example, the first substrate 200 may be coupled to the legs 126 of the barrel holder 120 using a separate coupling member. As a specific example, the first substrate 200 may be fixed to the legs 126 of the barrel holder 120 using a bolt or an adhesive. However, the member for coupling between the first substrate 200 and the barrel holder 120 is not limited to the bolt and the adhesive.

An electronic component necessary for an operation of the camera module 12 may be mounted on the first substrate 200. For example, a power supply unit 240 that may be connected to an external power supply may be mounted on one surface or the other surface of the first substrate 200. However, the electronic component mounted on the first substrate 200 is not limited to the power supply unit 240.

The first substrate 200 may include a component for electrically connection to another component (for example, the second substrate 300). For example, one or more first connection terminals 220 may be formed on one surface (a bottom surface in FIG. 12) of the first substrate 200. The first connection terminal 220 may be electrically connected to an image sensor 210. For example, the first connection terminal 220 may be electrically connected to the power supply unit 240 through a printed circuit formed inside or on the surface of the first substrate 200.

A window 230 through which light may pass may be formed in the first substrate 200. The window 230 may be formed at the center of the first substrate 200, such that light incident through the lenses L1 and L2 may reach the second substrate 300. For reference, although not illustrated in FIG. 12, a filter may be disposed in the window 230 as needed.

The second substrate 300 may be spaced apart from the first substrate 200 at a predetermined interval. For example, the second substrate 300 may be spaced apart from one surface (that is, the bottom surface) of the first substrate 200 by a predetermined distance to prevent interference with the electronic component mounted on an upper side of the second substrate 300 or the bottom surface of the first substrate 200.

An electronic component necessary for driving of the camera module 10 may be mounted on the second substrate 300. For example, an image sensor 310 for converting an optical signal incident through the lenses L1 and L2 into an electrical signal may be mounted on the second substrate 300. However, the electronic component installed or mounted on the second substrate 300 is not limited to the image sensor 310. For example, a passive element or a driving element for assisting driving of the image sensor 310 may be further mounted on the second substrate 300.

The second substrate 300 may include a component for electrical connection to the first substrate 200. For example, one or more second connection terminals 320 may be formed on one surface (an upper surface in FIG. 12) of the second substrate 300. The second connection terminal 320 may be electrically connected to the image sensor 310. For example, the second connection terminal 320 may be electrically connected to the image sensor 310 through a printed circuit formed inside or on a surface of the second substrate 300.

The terminal connector 400 may electrically connect the first substrate 200 and the second substrate 300 to each other. In detail, the terminal connector 400 may be in contact with each of the first connection terminal 220 of the first substrate 200 and the second connection terminal 320 of the second substrate 300 to electrically connect the first substrate 200 and the second substrate 300 to each other. The terminal connector 400 may be fixed to the first substrate 200 or the second substrate 300. For example, one end of the terminal connector 400 may be fixed to the first connection terminal 220 of the first substrate 200 or to the second connection terminal 320 of the second substrate 300. A detailed configuration of the terminal connector 400 and effects thereof will be described in detail with reference to FIGS. 13 and 14.

The housing 500 may accommodate important components of the camera module 12. For example, the lens module 100, the first substrate 200, the terminal connector 400, and the second substrate 300 may be disposed in the accommodation space 510 of the housing 500. The lens module 100, the first substrate 200, the terminal connector 400, and the second substrate 300 may be sequentially disposed in the accommodation space 510 of the housing 500. In detail, the second substrate 300 may be disposed at the lowermost portion of the accommodation space 510, and the terminal connector 400, the first substrate 200, and the lens module 100 may be sequentially disposed above the second substrate 300. The lens module 100, the first substrate 200, the terminal connector 400, and the second substrate 300 may be sequentially stacked in the accommodation space 510 of the housing 500 and coupled to or electrically connected to one another. For example, the first substrate 200, the terminal connector 400, and the second substrate 300 may be stacked in the accommodation space 510 of the housing 500 and electrically connected to one another at the same time. Therefore, in the camera module 12 according to the present exemplary embodiment, a separate process for connecting the first substrate 200 and the second substrate 300 to each other may be omitted, and the flexible substrate and a space for bending deformation of the flexible substrate required for electrical connection between the first substrate 200 and the second substrate 300 may also be omitted or reduced.

The cover member 700 may fix the lens barrel 110 to the barrel holder 120. For example, the cover member 700 may be coupled to the barrel holder 120 using a screw, an adhesive, or the like to firmly fix the lens barrel 110 to the barrel holder 120.

The airtight members 810 and 820 may block a gap between the members of the camera module 12. As an example, a first airtight member 810 may block a gap between the lens barrel 110 and the cover member 700, and a second airtight member 820 may block a gap between the lens barrel 110 and the barrel holder 120. For reference, although not illustrated in FIG. 12, a separate airtight member may be further disposed between the barrel holder 120 and the housing 500 if necessary.

Figure 13:
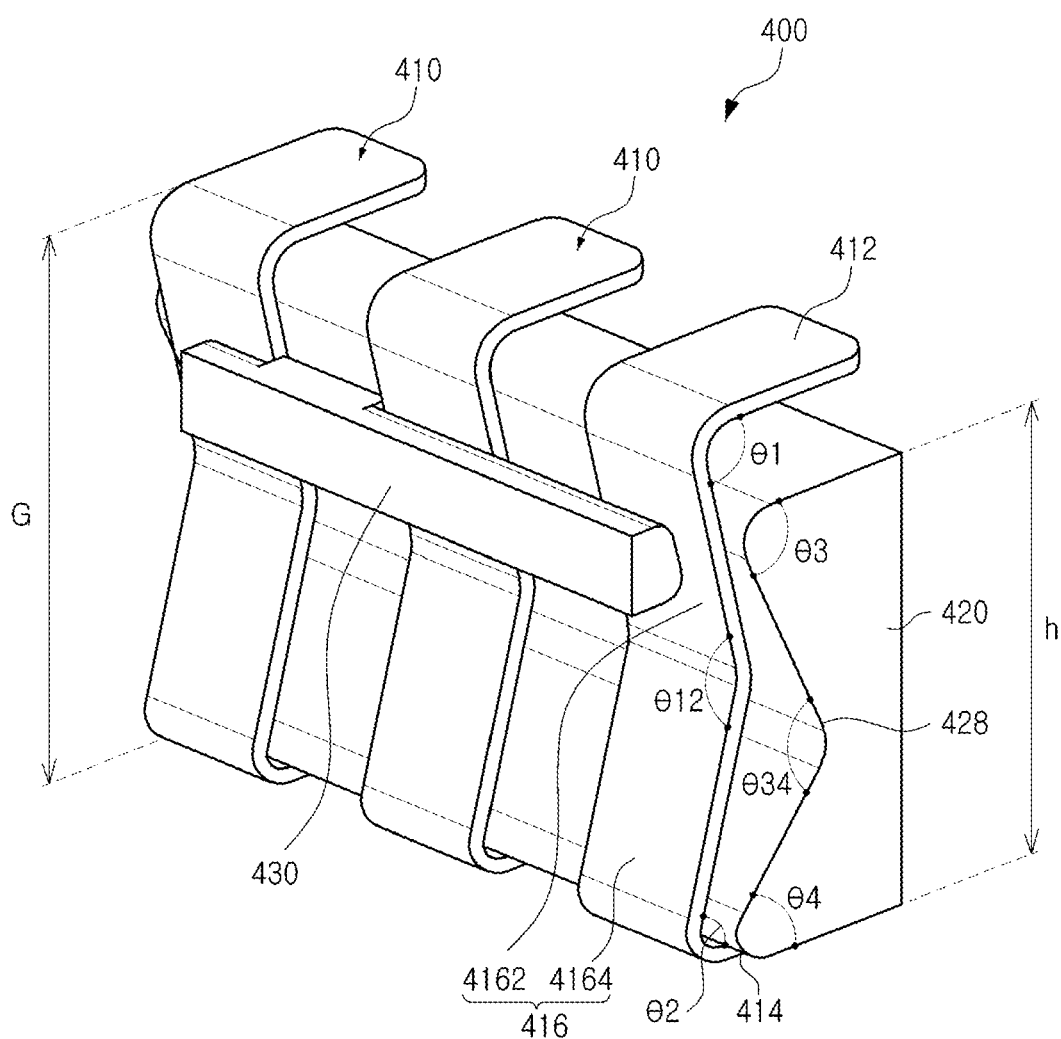
FIG. 13 is an enlarged perspective view of a terminal connector illustrated in FIG. 12.
Figure 14:
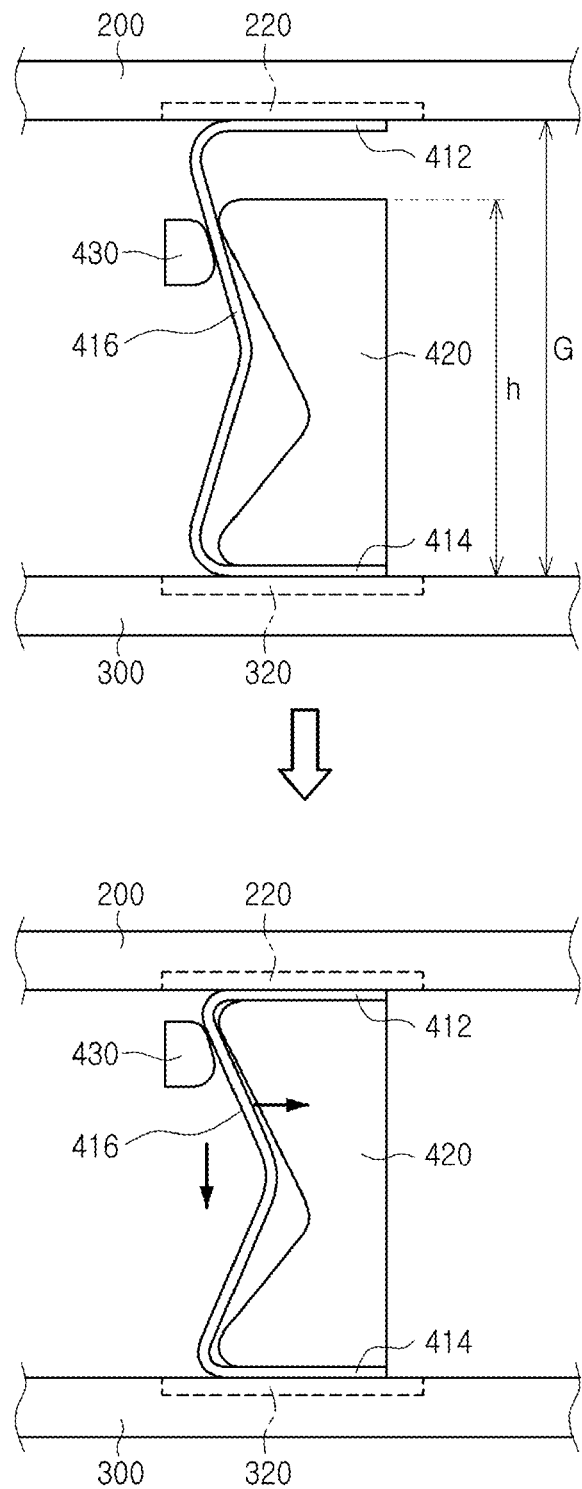
FIG. 14 is a cross-sectional view illustrating an operating state of the terminal connector according to positions of first and second substrates.

Next, the terminal connector will be described in detail with reference to FIGS. 13 and 14.

The terminal connector 400 according to the present specification may include a connecting member 410 and a support member 420. The connecting member 410 may be formed of a metal material to electrically connect the first connection terminal 220 of the first substrate 200 and the second connection terminal 320 of the second substrate 300 to each other, and the support member 460 may be formed of a material having a predetermined rigidity to maintain a preset degree of compression deformation or compression displacement of the connecting member 410. The number of connecting members 410 may be plural. For example, the terminal connector 400 may include three connecting members 410 arranged at intervals in one direction of the support member 420 as illustrated in FIG. 13. However, the number of the connecting members 410 included in the terminal connector 400 is not limited to three. For example, the terminal connector 400 may include three or more connecting members 410 according to the type of the camera module 10. Here, in one embodiment, a length covered by the plurality of connecting members 410 may be smaller than a length of the support member 420.

The connecting member 410 may include a first connection portion 412, a second connection portion 414, and a deformable portion 416. The first connection portion 412 may be in contact with the first connection terminal 220 of the first substrate 200, and may be formed so as to maximize a contact area between the first connection portion 412 and the first connection terminal 220. For example, the first connection portion 412 may be disposed to face the first connection terminal 220, and may be formed parallel to one surface (that is, the surface) of the first connection terminal 220. The second connection portion 414 may be in contact with the second connection terminal 320 of the second substrate 300, and may be formed so as to maximize a contact area between the second connection portion 414 and the second connection terminal 320. For example, the second connection portion 414 may be disposed to face the second connection terminal 320, and may be formed parallel to one surface (that is, the surface) of the second connection terminal 320. The deformable portion 416 may connect the first connection portion 412 and the second connection portion 414 to each other, and may be configured to be able to vary a distance G between the first connection portion 412 and the second connection portion 414. For example, the deformable portion 416 may be elastically deformed by an external force applied to the connecting member 410.

The deformable portion 416 may include a first connecting portion 4162 and a second connecting portion 4164. The first connecting portion 4162 may be formed to have a first angle θ1 with respect to the first connection portion 412, and the second connecting portion 4164 may be formed to have a second angle θ2 with respect to the second connection portion 414. In addition, the first connecting portion 4162 and the second connecting portion 4164 may be formed to have a third angle θ12 with respect to each other. As described above, when an external force is applied to the connecting member 410, the deformable portion 416 formed as described above may be deformed in such a manner that the angles θ1, θ2, and θ12 are decreased.

The deformable portion 416 may be quantitatively or formally deformed by the external force applied to the connecting member 410. As a specific example, the angles θ1, θ2, and θ12 of the deformable portions 416 may have a predetermined magnitude relationship. For example, the first angle θ1 and the second angle θ2 may have the same size, and the sum of the first angle θ1 and the second angle θ2 may be equal to the third angle θ12.

Since the deformable portion 416 satisfying the above-described relationship may always keep positions of the first connection portion 412 and the second connection portion 414 in a horizontal direction constant, reliability of the electrical connection between the first substrate 200 and the second substrate 300 by the connecting member 410 may be improved.

The support member 420 may be disposed between the first connection portion 412 and the second connection portion 414, and may have a height h smaller than the distance G between the first connection portion 412 and the second connection portion 414. The support member 420 may be configured in such a manner that surface-contact between the connection portions 412 and 414 of the connecting member 410 and the connection terminals 220 and 320 may be firmly made. For example, an upper surface portion 422 and a lower surface portion 424 of the support member 420 may be formed parallel to the first connection terminal 220 and the second connection terminal 320, respectively. The upper surface portion 422 and the lower surface portion 424 of the support member 420 formed as described above may apply a force to the connection portions 412 and 414 deformed by an external impact or heat so that the connection portions 412 and 414 are in close contact with the first connection terminal 220 and the second connection terminal 320, respectively.

The support member 420 may include a component for guiding or limiting the bending deformation of the deformable portion 416. For example, the support member 420 may include a recess portion 428 facing the deformable portion 416 and having predetermined inclinations θ3 and θ4 with respect to the upper surface portion 422 and the lower surface portion 424, respectively. The recess portion 428 may have a shape substantially similar to that of the deformable portion 416. However, the recess portion 428 does not necessarily have a shape that is the same as or similar to the deformable portion 416. For example, an angle θ34 formed at the center of the recess portion 428 may be smaller than the third angle θ12 of the deformable portion 416. For reference, in a case where the angle θ34 of the recess portion 428 is smaller than the third angle θ12 of the deformable portion 416, there is an advantage in that compression deformation of the deformable portion 416 may be smoothly induced. However, the angle θ34 of the recess portion 428 is not necessarily smaller than the third angle θ12 of the deformable portion 416.

The support member 420 may further include a component for suppressing or reducing deformation or damage of the upper surface portion 422, the lower surface portion 424, and the recess portion 428. For example, the support member 410 may further include support portions 426 extending in a direction in which the upper surface portion 422 and the lower surface portion 424 oppose each other. The support portions 426 may be provided in plural to be arranged at predetermined intervals in a width direction of the support member 420.

The support member 420 may further include a component for aligning the position of the first connection portion 412 or the second connection portion 414. For example, a groove 4242 that may accommodate the second connection portion 414 and align the position of the second connection portion 414 may be formed in the lower surface portion 424 of the support member 420. For reference, in the accompanying drawings, only the lower surface portion 424 of the support member 420 has the groove 4242, but the groove may also be formed in the upper surface portion 422 of the support member 420 as needed. The support member 420 may further include a component for preventing separation of the connecting member 410. For example, a clip 430 for pressing the connecting member 410 toward the support member 420 may be formed on the support member 420.

The support member 420 may fix the connecting member 410 to the first substrate 200 or the second substrate 300. For example, the support member 420 may be firmly fixed to any one of the first substrate 200 and the second substrate 300 by an adhesive or a separate coupling member.

Meanwhile, although not separately illustrated, the terminal connector 400 according to the present exemplary embodiment may be deformed into the shapes illustrated in FIGS. 7 through 11, similarly to the above-described exemplary embodiment.

The camera module 12 according to the present exemplary embodiment may further include an alignment member for aligning the positions of the first substrate 200 and the second substrate 300. The form of the above-described alignment member will be described with reference to FIGS. 15 and 16.

Figure 15:
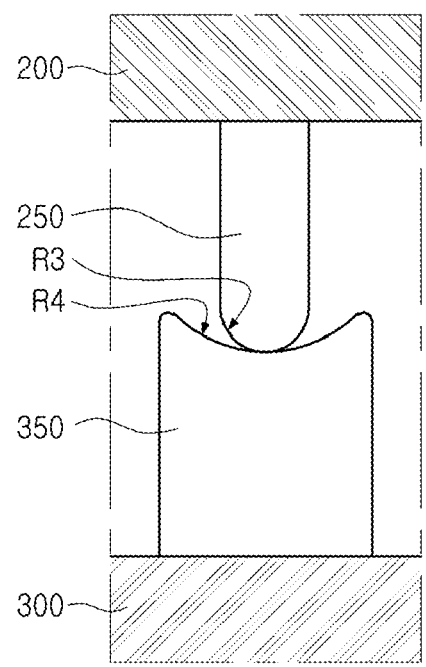
FIG. 15 is an enlarged view of a first alignment member illustrated in FIG. 12.

The alignment member of the camera module 12 according to an aspect may be implemented as protrusions 250 and 350 formed on the first substrate 200 and the second substrate 300, respectively, as illustrated in FIG. 15. As a specific example, the protrusion 250 of the first substrate 200 may have a hemispherical shape whose end portion has a first radius R3, and the protrusion 350 of the second substrate 300 may have a shape whose end portion has a groove having a second radius R4. The first radius R3 and the second radius R4 may be different from each other. For example, the first radius R3 may be smaller than the second radius R4.

The curved shapes having different sizes of the protrusion 250 of the first substrate 200 and the protrusion 350 of the second substrate 300 formed as described above may come into contact with each other to align relative positions of the first and second substrates 200 and 300.

Figure 12:
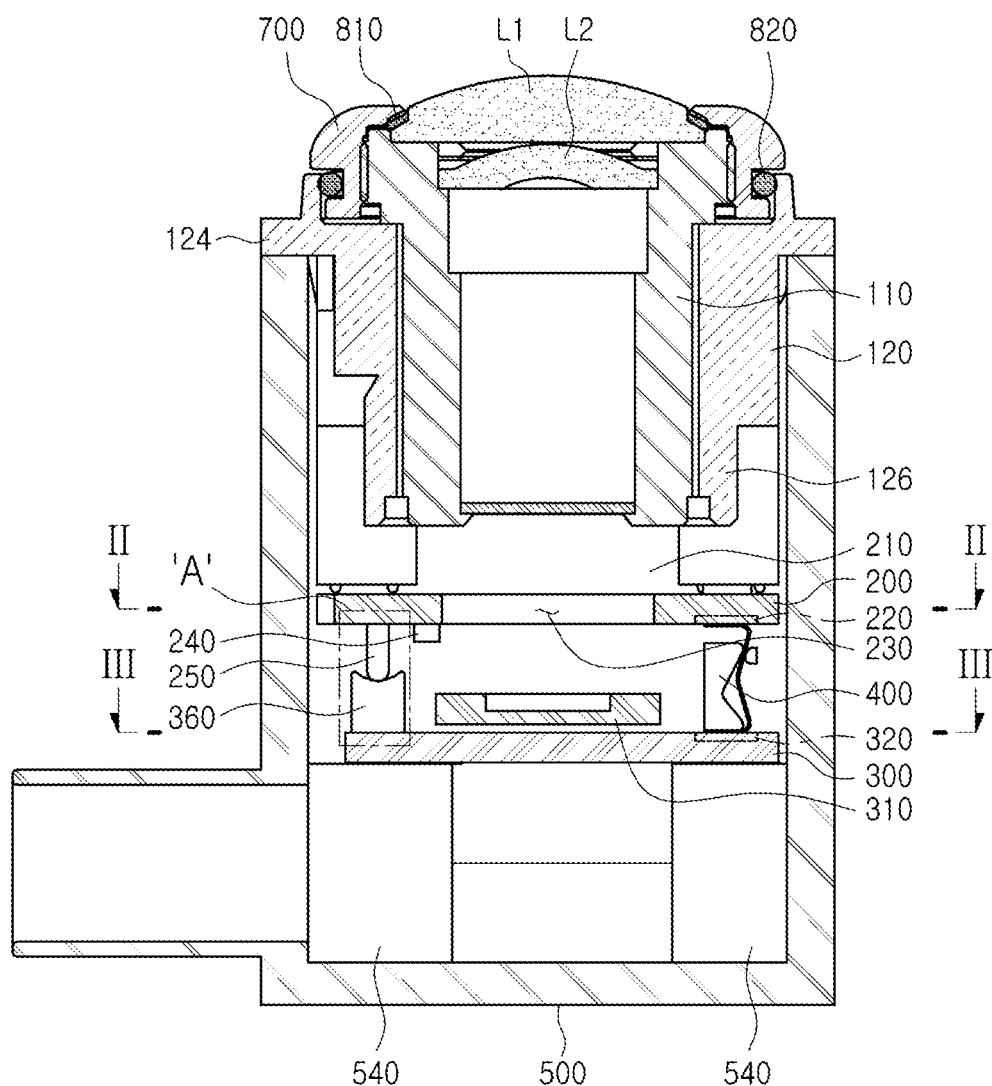
FIG. 12 is a cross-sectional view of a camera module according to another exemplary embodiment.
Figure 16A:
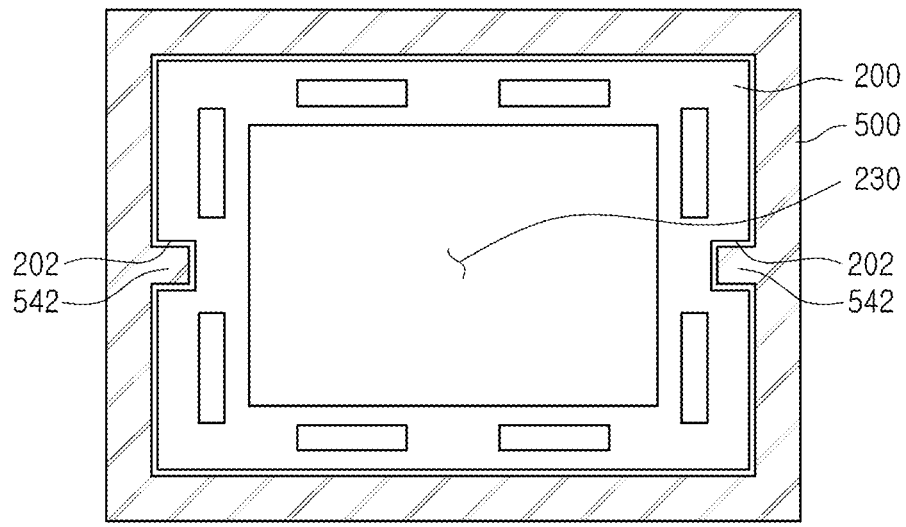
FIGS. 16A and 16B are cross-sectional views of the camera module illustrated in FIG. 12.
Figure 16B:
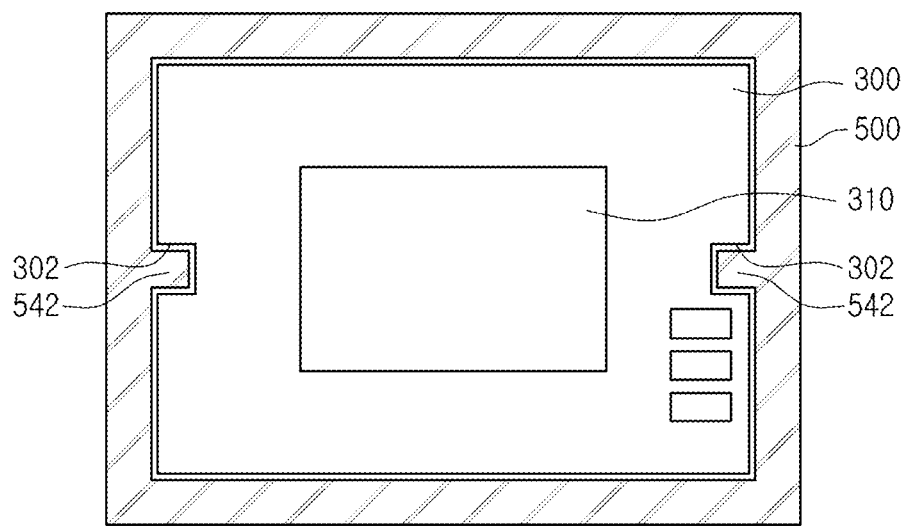

FIGS. 16A and 16B are cross-sectional views of the camera module illustrated in FIG. 12.

The alignment member of the camera module 12 according to an aspect may be implemented as grooves 202 and 302 and protrusions 542 respectively formed at the substrates 200 and 300 and the housing 500 as illustrated in FIG. 16. The grooves 202 and 302 may be formed in side surfaces of the first substrate 200 and the second substrate 300, respectively. For example, the first groove 202 may be formed in each of opposite side surfaces of the first substrate 200, and the second groove 302 may be formed in each of opposite side surfaces of the second substrate 300. The protrusion 542 may be formed on an inner surface of the housing 500. For example, a pair of protrusions 542 may be formed on the inner surfaces of the housing 500 that face the grooves 202 and 302 of the substrates 200 and 300, respectively.

The positions of the first substrate 200 and the second substrate 300 may be naturally aligned through coupling between the substrates 200 and 300 and the housing 500. In detail, the position of the first substrate 200 with respect to the housing 500 in the horizontal direction may be aligned through coupling between the groove 202 and the protrusion 542, and the position of the second substrate 300 with respect to the housing 500 in the horizontal direction may be aligned through coupling between the groove 302 and the protrusion 542. In addition, the relative positions of the first substrate 200 and the second substrate 300 may be aligned as the first substrate 200 and the second substrate 300 are integrally fitted onto the protrusion 542 formed on the housing 500.

In the camera module 12 according to the present exemplary embodiment, the first substrate 200 and the second substrate 300 may be electrically connected to each other through a process of disposing the first substrate 200 above the second substrate 300, and a constant distance between the first substrate 200 and the second substrate 300 may be maintained, which is advantageous.

In addition, since the camera module 12 according to the present exemplary embodiment facilitates alignment of the positions of the first substrate 300 and the second substrate 300 with respect to the housing 500, an assembly defect rate of the camera module 12 may be reduced. In addition, since the camera module 12 according to the present exemplary embodiment may maintain a considerable distance between the lens barrel 110 and the image sensor 310, a telescopic optical imaging system requiring a long focal length may be implemented.

As set forth above, according to the exemplary embodiment in the present disclosure, reliability of contact between the substrates spaced apart from each other may be improved. In addition, an assembly process for the camera module may be simplified, and an assembly time for the camera module may be shortened.

While exemplary embodiments have been shown and described above, it will be apparent to those skilled in the art that modifications and variations could be made without departing from the scope of the present disclosure as defined by the appended claims.

What is claimed is:

1. A camera module comprising:
a first substrate on which an image sensor for converting an optical signal incident through a lens module into an electrical signal is disposed and a first connection terminal is disposed;
a second substrate spaced apart from the first substrate and including a second connection terminal disposed in a position facing the first connection terminal; and
a terminal connector electrically connecting the first connection terminal and the second connection terminal to each other and configured to maintain a preset distance between the first substrate and the second substrate,
wherein the terminal connector includes:
a connecting member including a first connection portion connected to the first connection terminal, a second connection portion connected to the second connection terminal, and a deformable portion that connects the first connection portion and the second connection portion to each other and is elastically deformable according to the preset distance between the first substrate and the second substrate; and
a support member disposed between the first connection portion and the second connection portion and configured to maintain the preset distance between the first substrate and the second substrate.

2. The camera module of claim 1, wherein the deformable portion protrudes toward the support member.

3. The camera module of claim 1, wherein the deformable portion includes a first connecting portion having a first angle with respect to the first connection portion, and a second connecting portion having a second angle with respect to the second connection portion and connected to the first connecting portion.

4. The camera module of claim 1, wherein the deformable portion has a plurality of bends.

5. The camera module of claim 1, wherein the deformable portion has an arch shape.

6. The camera module of claim 1, wherein the support member is coupled to the second substrate so as to fix the second connection portion to the second connection terminal.

7. The camera module of claim 1, wherein the first connection portion and the second connection portion extend parallel to the first connection terminal and the second connection terminal, respectively.

8. The camera module of claim 1, wherein the first connection portion or the second connection portion has a bend.

9. The camera module of claim 8, wherein a distance from the first connection portion to the second connection portion is larger than a height of the support member.

10. The camera module of claim 1, wherein the support member includes a clip for preventing the connecting member from being separated.

11. The camera module of claim 10, wherein the clip protrudes from a surface of the support member and further extends to support a portion of the deformable portion, and the portion of the deformable portion is disposed between the clip and the support member.

12. The camera module of claim 1, wherein the terminal connector includes a plurality of connecting members that are spaced apart from each other at predetermined intervals in a width direction of the support member and are disposed around the support member.

13. The camera module of claim 12, wherein, in the width direction of the support member, a length covered by the plurality of connecting members is smaller than a length of the support member.

14. The camera module of claim 1, wherein the support member includes:
an upper surface portion configured to support the first connection portion;
a lower surface portion having a groove for accommodating the second connection portion;
a recess portion connecting the upper surface portion and the lower surface portion to each other and selectively coming into contact with the deformable portion when the deformable portion is elastically deformed; and
a support portion extending in a direction in which the upper surface portion and the lower surface portion oppose each other.

15. The camera module of claim 14, wherein the support portion is provided in plural and arranged at predetermined intervals in a width direction of the support member.

16. The camera module of claim 1, further comprising a power supply unit disposed on the second substrate and configured to supply a current required to drive the image sensor.

17. A camera module comprising:
a first substrate including a window through which light emitted from a lens module is incident is formed and having one surface on which a first connection terminal is disposed;
a second substrate including an image sensor for converting an optical signal incident through the window into an electrical signal and a second connection terminal disposed in a position facing the first connection terminal;
a terminal connector electrically connecting the first connection terminal and the second connection terminal to each other and configured to maintain a preset distance between the first substrate and the second substrate; and
a housing accommodating the lens module, the first substrate, and the second substrate,
wherein the terminal connector includes:
a connecting member including a first connection portion connected to the first connection terminal, a second connection portion connected to the second connection terminal, and a deformable portion that connects the first connection portion and the second connection portion to each other and is elastically deformable according to the preset distance between the first substrate and the second substrate; and
a support member disposed between the first connection portion and the second connection portion and configured to maintain the preset distance between the first substrate and the second substrate.

18. The camera module of claim 17, further comprising alignment members disposed on the first substrate and the second substrate and configured to align a relative position of the second substrate with respect to the first substrate.

19. The camera module of claim 18, wherein the alignment members include:
a hemispherical protrusion formed on the first substrate; and
a groove formed in the second substrate and configured to accommodate the protrusion.

20. The camera module of claim 18, wherein the alignment members include protrusions and grooves formed at an inner side surface of the housing and side surfaces of the first substrate and the second substrates.

* * * * *